(12) United States Patent
Dyer et al.

(10) Patent No.: US 7,031,456 B2
(45) Date of Patent: Apr. 18, 2006

(54) METHOD, DEVICE AND SYSTEM FOR OUTPUT IMPEDANCE CALIBRATION THAT INVARIABLY MAXIMIZES HYBRID PERFORMANCE

(75) Inventors: Kenneth C. Dyer, Davis, CA (US); Hiroshi Takatori, Sacramento, CA (US)

(73) Assignee: Key Eye, Sacramento, CA (US)

( * ) Notice: Subject to any disclaimer, the term of this patent is extended or adjusted under 35 U.S.C. 154(b) by 57 days.

(21) Appl. No.: 10/923,321

(22) Filed: Aug. 20, 2004

(65) Prior Publication Data

US 2005/0069394 A1    Mar. 31, 2005

Related U.S. Application Data

(60) Provisional application No. 60/506,472, filed on Sep. 26, 2003.

(51) Int. Cl.
    *H04M 7/04* (2006.01)

(52) U.S. Cl. ............ 379/398; 379/399.01; 379/402

(58) Field of Classification Search ............ 379/398, 379/399.01, 402
See application file for complete search history.

(56) References Cited

U.S. PATENT DOCUMENTS

| | | | |
|---|---|---|---|
| 5,329,585 A | 7/1994 | Susak et al. | 379/399.01 |
| 6,496,988 B1 | 12/2002 | Hammond | 4/317 |
| 6,628,779 B1 | 9/2003 | Pietrowiez | 379/404 |
| 6,687,235 B1 | 2/2004 | Chu | 370/286 |
| 6,704,349 B1 | 3/2004 | Masenten | 375/219 |
| 2001/0036261 A1* | 11/2001 | Prendergast et al. | 379/398 |
| 2003/0099208 A1 | 5/2003 | Graziano et al. | 370/289 |
| 2004/0151238 A1 | 8/2004 | Masenten | 375/219 |
| 2004/0174990 A1* | 9/2004 | Apfel | 379/398 |

OTHER PUBLICATIONS

Moyal, M., Groepl, M., and Blon, T., "A 25-kft, 768-kb/s CMOS Analog Front End for Multiple-Bit-Rate DSL Transceiver," IEEE Journal of Solid-State Circuits, vol. 34, No.12, Dec. 1999, pp. 1961-1972.

(Continued)

*Primary Examiner*—Jefferey F. Harold
(74) *Attorney, Agent, or Firm*—Lumen Intellectual Property Services, Inc.

(57) ABSTRACT

A hybrid system with adjustable on-chip components and a method calibrating the same invariably maximizes hybrid performance despite of on- and off-chip component mismatches and imperfections. The hybrid system has a main DAC, a replica DAC, and three or four resistors. Both DACs are directly connected to digital data. An adjustable resistor is connected to the main DAC and is calibrated such that output impedance is automatically adjusted to match an off-chip load impedance Z. A replica DAC current K is calibrated for optimum DC matching in presence of Z. An adjustable capacitor C2 is calibrated for slope-matching (bandwidth matching). If Z changes, the calibration procedure should be repeated for optimal performance. These three calibration mechanisms can be utilized individually or in combination. The present invention is compatible with both analog and digital echo-cancellers.

16 Claims, 4 Drawing Sheets

OTHER PUBLICATIONS

Tai-Cheng Lee and Behzad Razavi, A 125-MHz Mixed-Signal Echo Canceller for Gigabit Ethernet on Copper Wire, IEEE Journal of Solid-State Circuits, vol. 36, No. 3, Mar. 2001, p. 366.

Roo, P.; Sutardja, S.; Wei, S.; Aram, F.; Cheng, Y., "A CMOS Transceiver Analog Front-End for Gigabit Ethernet over CAT-5 Cables," Solid-State Circuits Conference, 2001. Digest of Technical Papers. ISSCC. 2001 IEEE International, Feb. 5-7, 2001, pp. 310-311, 458.

Nauta, B.; Dijkstra, M.B., "Analog Line Driver with Adaptive Impedance Matching," IEEE Journal of Solid-State Circuits, vol. 33, Issue: 12, Dec. 1998, pp. 1992-1998.

* cited by examiner

METHOD, DEVICE AND SYSTEM FOR OUTPUT IMPEDANCE CALIBRATION THAT INVARIABLY MAXIMIZES HYBRID PERFORMANCE

CROSS-REFERENCES TO RELATED APPLICATIONS

This application claims the benefit of a provisional Patent Application No. 60/506,472, filed Set. 26, 2003, which is incorporated herein by reference in its entirety.

BACKGROUND OF THE INVENTION

1. Field of the Invention

This invention relates generally to communication systems. More particularly, it relates to an output impedance method calibrating a hybrid local-echo canceller and a hybrid structure implementing the same. An implementation of the invention is also compatible with a mixed-signal echo canceller.

2. Description of the Related Art

A hybrid generally refers to a device that converts a bi-directional path into two separate unidirectional paths for transmit and receive. In full-duplex communication systems, a hybrid local-echo canceller is typically used to separate incoming receive signals from outgoing transmit signals.

FIG. 1 shows a Pam-4 current-mode hybrid system 100 comprising two digital-to-analog converters (Main DAC and Replica DAC), four resistors (R1, R2, R3, and R4), and three capacitors (C1, C2, and Cbig). Cbig and $Z_L$ are off-chip components. $Z_L$ is a complex impedance that represents the channel load. The DACs, C1, C2, R1–R4, digital data and current sources are on-chip components. Exemplary Configuration 1 shows the values of these on- and off-chip components for the ideal case of $Z_L$=50 Ohms.

The DACs produce a current based on digital data supplied at the transmit interface. The Main DAC acts as a transmitter, sending a large current ITX through the direct current (DC) blocking capacitor Cbig to the load impedance $Z_L$. A fraction of ITX, labeled as Itx, is sent through a resistive network to the Replica DAC, which is a copy of the Main DAC connected thereto with opposite polarity. The purpose of the Replica DAC is to cancel Itx from going to the receiver. With Itx signal cancelled, only the received signal Irx is sent into the receiver.

Without calibration, the hybrid system 100 suffers from certain drawbacks as well as performance limitations. Most notably, the accuracy of the transmit signal cancellation is diminished by component mismatches, variations in the load impedance $Z_L$, and variations in the on-chip component values.

More specifically, mismatches in absolute values between the off-chip load impedance $Z_L$ and the four on-chip resistors R1–R4 lead to incomplete cancellation of the transmit current Itx, which reduces effectiveness of the hybrid system 100. Similarly, mismatches in the frequency response at nodes X and Y lead to high frequency noise, which reduces the performance of the hybrid system 100.

Several schemes have been proposed to address some of the aforementioned deficiencies in various ways. An exemplary approach is disclosed by Moyal, M., Groepl, M., and Blon, T., "A 25-kft, 768-kb/s CMOS Analog Front End for Multiple-Bit-Rate DSL Transceiver," IEEE Journal of Solid-State Circuits, Vol. 34, No. 12, December 1999, pp. 1961–1972. In this approach, a calibration engine is employed to adjust the impedance at node Y, using a combination of on- and off-chip components. A digital signal processor (DSP) engine driven by a 100% digital echo canceller controls the parameters of these on- and off-components to minimize the effects of bandwidth and resistor matching. However, the output impedance of the digital echo canceller is not calibrated, which means that its return loss is not properly controlled and which means that a poor return loss is likely to result. In addition, this approach requires a 100% digital echo canceller as well as an increased number of package pins to access the off-chip components.

Another approach is disclosed by Tai-Cheng Lee and Behzad Razavi, "A 125-MHz Mixed-Signal Echo Canceller for Gigabit Ethernet on Copper Wire," IEEE Journal of Solid-State Circuits, Vol. 36, No. 3, March 2001, p. 366. In this approach, the transmit termination and hybrid is located off-chip and slope-matching is not addressed. Other gigabit Ethernet implementations also do not address slope-matching, see, e.g., Roo, P.; Sutardja, S.; Wei, S.; Aram, F.; Cheng, Y., "A CMOS Transceiver Analog Front-End for Gigabit Ethernet over CAT-5 Cables," Solid-State Circuits Conference, 2001, Digest of Technical Papers, ISSCC, 2001 IEEE International, 5–7 Feb. 2001, pp. 310–311, 458.

Clearly, there is a continuing need in the art for a new hybrid system that is capable of providing outstanding performance without suffering from the aforementioned performance limitations caused by on- and off-chip component imperfections and/or mismatches. The present invention addresses this need.

BRIEF SUMMARY OF THE INVENTION

An object of the present invention is to significantly reduce or otherwise minimize the effects of on- and off-chip component imperfections and/or mismatches on hybrid performance. This goal is achieved in a hybrid system with adjustable components and a method that calibrates these adjustable components.

According to an aspect of the invention, the hybrid system has on- and off-chip components including four resistors, a main DAC, a replica DAC, three capacitors, and a complex output impedance representing the channel load. At least three components are adjustable: a resistor, a current source, and a slope-matching capacitor. The adjustable resistor can be constructed from an array of switched resistors, a voltage-controller resistor, or a combination of both. The adjustable capacitor can be constructed from a capacitor array with pass-transistors configured to switch trim elements in or out.

According to another aspect of the invention, the calibration method comprises the steps of a) calibrating an adjustable resistor R1 to match a load impedance Z; b) calibrating replica DAC current K for optimum DC matching in presence of the load impedance Z; and c) calibrating an adjustable capacitor C2 for slope-matching. More specifically, in step a), K is first disabled and DC is transmitted from the main DAC. Peak amplitude $A_{peak}$ is then measured at the receiver. Next, while random data are being transmitted, R1 is adjusted until the receiver input peak amplitude is on average half of $A_{peak}$.

In step b), K is enabled and set to a nominal value. Next, the timing recovery loop is forced so that the receiver and its corresponding transmitter are 180 degree out of phase. This forces the receiver to sample hybrid output between transitions. The procedure then increments bias current in discrete steps until sampled hybrid output is minimized on average. This determines the optimal K for the load impedance Z.

In step c), the timing recovery loop is forced again such that the receiver and the transmitter are on the exact same phase of the clock. Random data are again transmitted over a brief period of time through both the main DAC and the replica DAC. Sampled voltage is observed at the receiver input and the capacitor is appropriately adjusted until the voltage at the receiver input changes sign. At this point, these adjustable components are calibrated for optimal hybrid performance for the load impedance Z. In an ideal case, Z is 50 Ohms. If Z changes, the calibration procedure should be repeated for optimal performance.

The present invention is compatible with both types, i.e., analog and digital, of echo-cancellers. In an embodiment, a 0 dB loss hybrid system according to the present invention employs only three resistors, one of which is adjustable as described herein. This maximizes the gain on the hybrid. Although the three resistors hybrid system would be more sensitive to DAC mismatches, the calibration procedure disclosed herein advantageously mitigates the increased sensitivity.

According to the present invention, output impedance is automatically adjusted to match the channel load. This advantageously eliminates any buffer-amplifier stages. In addition, bandwidth matching is done via on-chip components. This advantageously adds flexibility to system-wide configuration since off-chip components are not required. Moreover, the direct connection between digital data and both the main and replica DACs advantageously enables the cancellation of any undesirable timing behavior.

Other objects and advantages of the present invention will become apparent to one skilled in the art upon reading and understanding the preferred embodiments described below with reference to the following drawings.

DETAILED DESCRIPTION OF THE INVENTION

Figure 3:
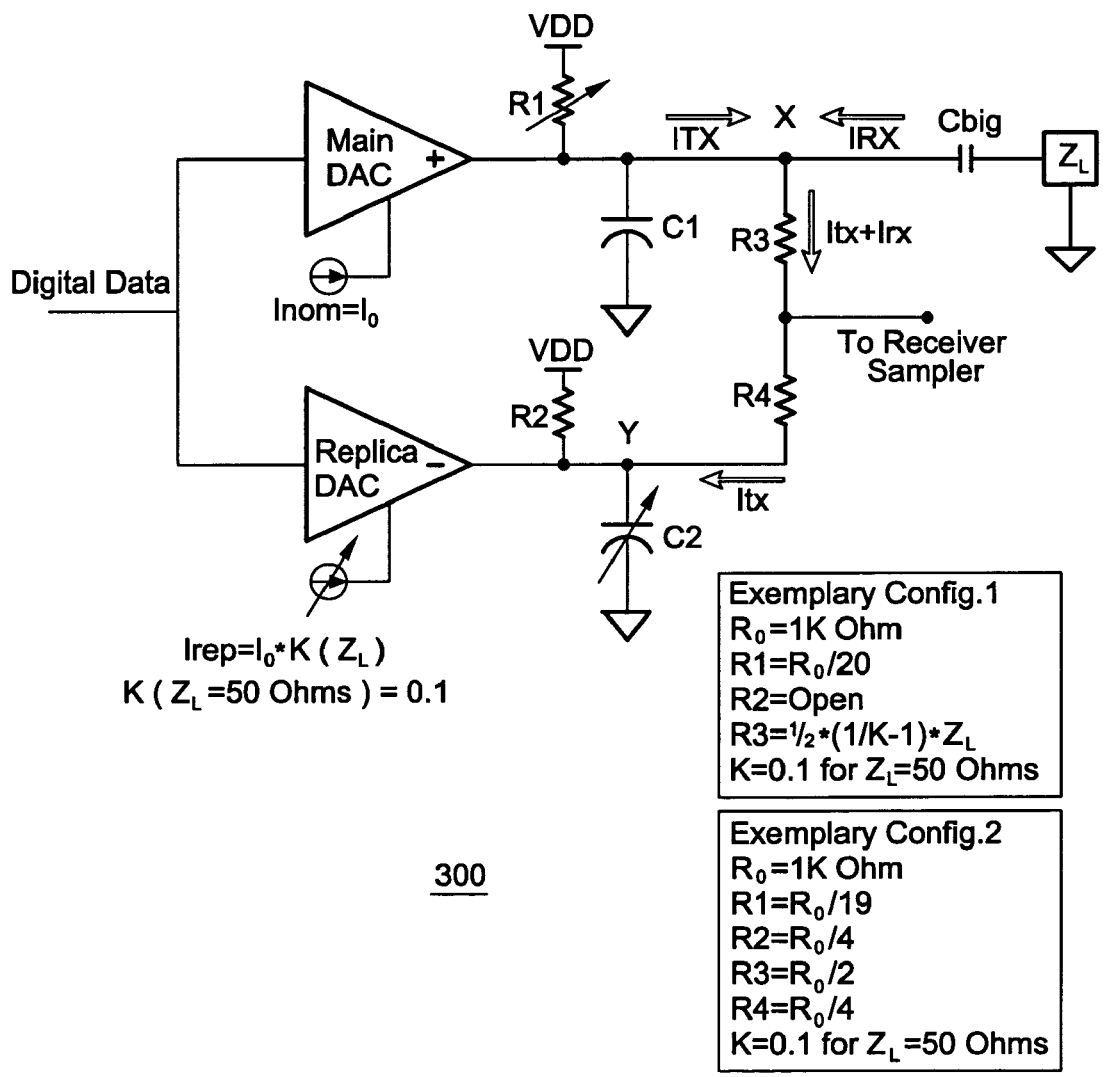
FIG. 3 schematically shows a hybrid system with adjustable components that mitigate the undesirable effects of on- and off-component imperfections/mismatches and that implement a particular calibration procedure to invariably maximize performance.

FIG. 3 shows an exemplary hybrid system 300 implementing the present invention. The hybrid system 300 has on- and off-chip components including an adjustable resistor R1 coupled to a Main DAC, an adjustable current source coupled to a Replica DAC, a resistor R2 coupled to the Replica DAC and a node Y, an adjustable capacitor C2 coupled to the node Y, a resistor R3 coupled to a node X and a Receiver, and a resistor R4 coupled to the Receiver and the node Y.

In addition to the adjustable capacitor C2, the hybrid system 300 further comprises a capacitor C1 coupled to the adjustable resistor R1 and the node X, and a capacitor Cbig coupled between the node X and a complex output impedance $Z_L$ representing the channel load.

Figure 1:
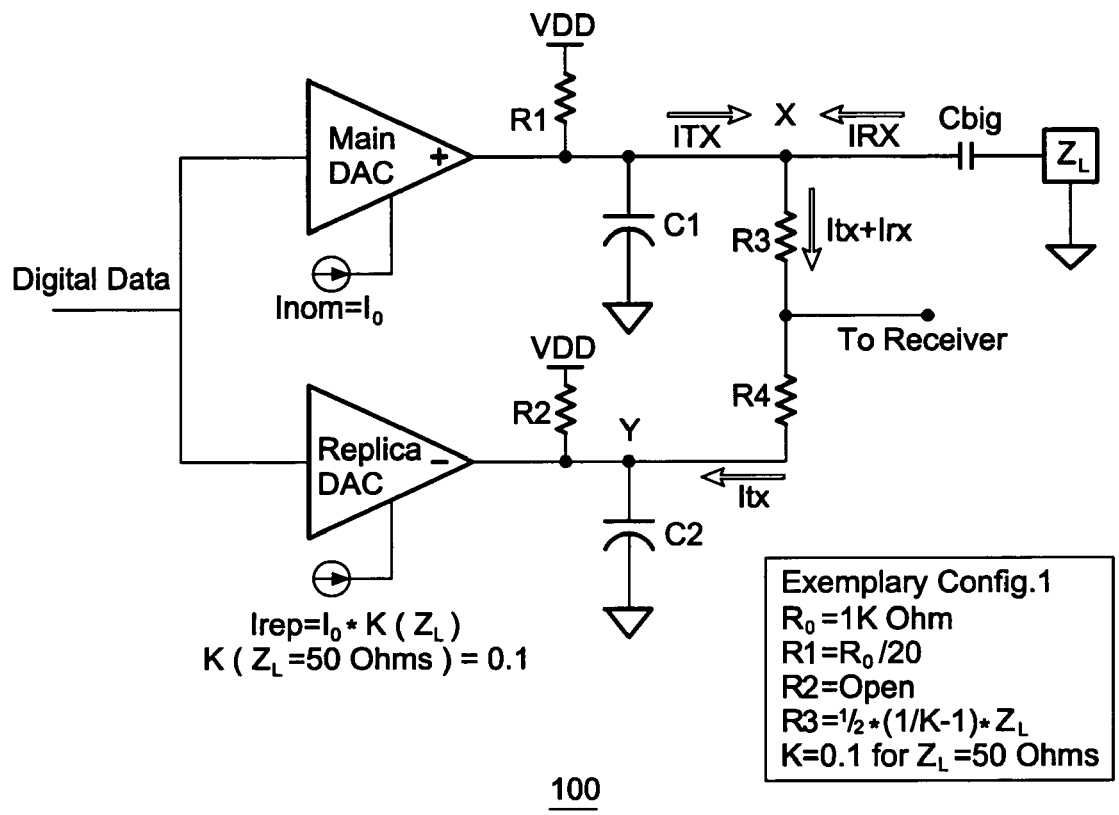
FIG. 1 shows a prior art Pam-4 current-mode hybrid system without adjustable components and without calibration.
Figure 2:
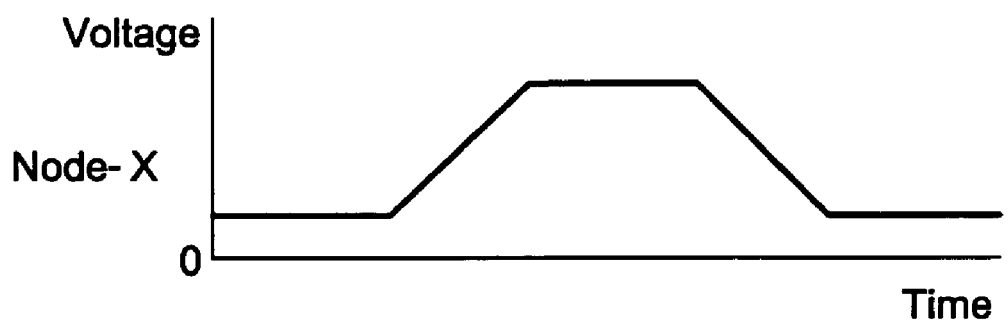
FIG. 2A graphically demonstrates a node X and a node Y having different bandwidths, assuming the receiver signal is absent.
FIG. 2B illustrates a scenario in which receiver input slope at X is greater than the slope at Y, indicating un-cancelled transmit signal.
FIG. 2C illustrates a scenario in which receiver input slope at X is less than the slope at Y, indicating un-cancelled transmit signal.
FIG. 2D illustrates a desired scenario in which receiver input slope at X matches the slope at Y, indicating that the transmit signal is cancelled during the transition.
Figure 2:
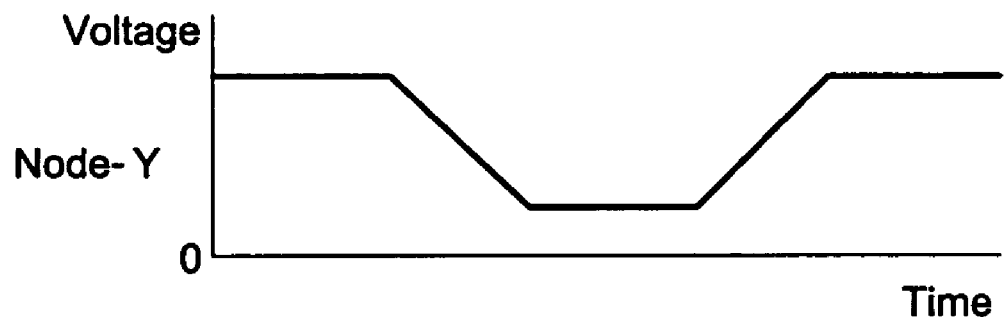
Figure 2:
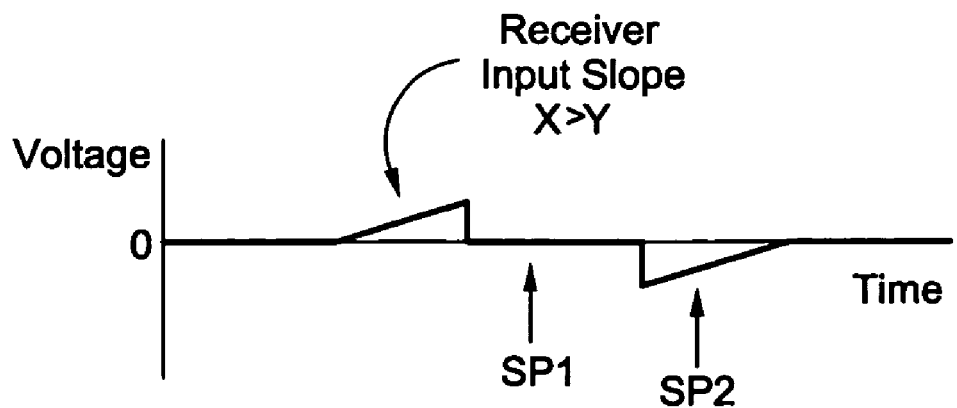
Figure 2:
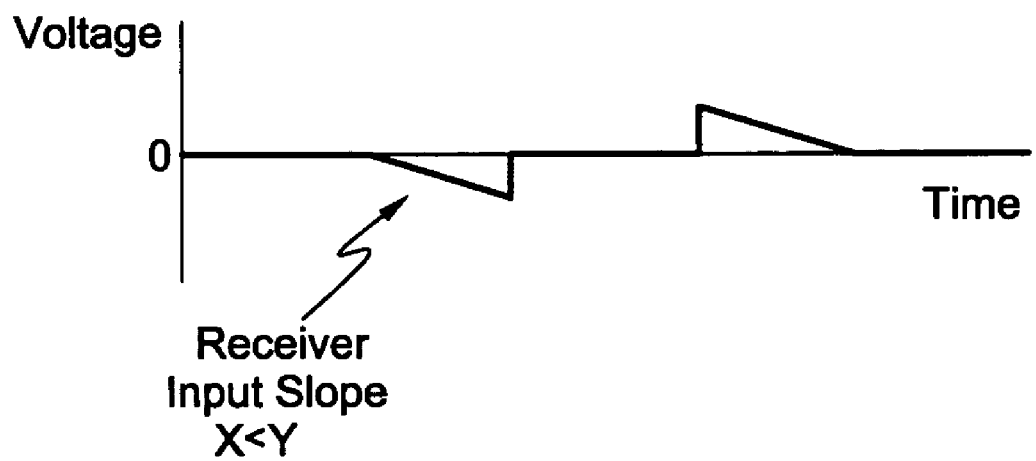
Figure 2:
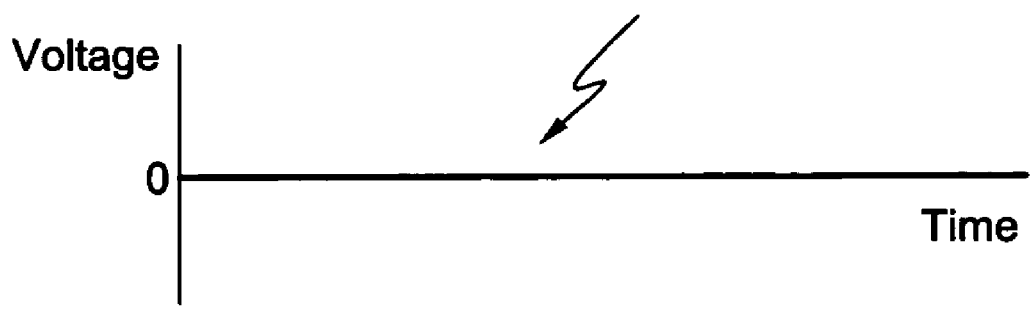

According to the present invention, the hybrid system 300 not only minimizes the effects of mismatches between on- and off-chip components, but also minimizes the effect of bandwidth-mismatches between nodes. FIG. 2A graphically demonstrates a scenario in which the nodes X and Y operate on two different bandwidths, assuming that the receiver signal is absent. Depending upon which slope is greater, un-cancelled transmit signal would have a positive or negative sign, as illustrated in FIGS. 2B–C. FIG. 2D illustrates the ideal situation in which the transmit signal is cancelled during transition, i.e., when the slope at X matches the slope at Y. The output impedance calibration according to the present invention employs, among others, an adjustable slope-matching capacitor that advantageously mitigates such undesirable bandwidth differences.

Before describing the method steps calibrating the hybrid system 300, it is important to note that both the Main DAC and the Replica DAC are directly connected to Digital Data. For optimum practical performance, it is critical that the exact digital signals, not buffered copies, drive both the Main DAC and the Replica DAC. This configuration reduces the hybrid sensitivity to jitter and bit skew and is better than conventional DAC configurations since any non-ideal timing behavior would be cancelled before reaching the receiver. Note that although the Main DAC and the Replica DAC in FIG. 3 appear to have the same physical size, this need not be the case in reality. In some embodiments, the Replica DAC is physically equal or smaller than the Main DAC.

The adjustable resistor can be constructed from an array of switched resistors, a voltage-controller resistor, or a combination of both. The adjustable capacitor can be constructed from a capacitor array with pass-transistors configured to switch trim elements in or out. The receiver could be of arbitrary complexity. Other implementations are also possible and anticipated. As one skilled in the art will appreciate, the present invention is not limited by any particular types of adjustable resistors, adjustable capacitors, receivers, or overall hybrid structures, so long as the following output impedance calibration method is implemented therein.

More specifically, the calibration method according to the present invention comprises three main steps. Step 1 calibrates the adjustable resistor R1 as follows:
   a. Disable Replica DAC current K (K=0).
   b. Transmit DC (constant current) from the Main DAC.
   c. Receiver measures input peak amplitude $A_{peak\_1}$.
   d. Transmit random data over a brief period of time, e.g., several nanoseconds.
   e. Adjust R1 until $A_{peak\_i}$ is on average exactly half of $A_{peak\_i}$ measured in step c.

At this point, R1 should be matched to $Z_L$. Step 1 exploits the fact that the IEEE XAUI Standard as well as echo-wave require AC coupling, as they are known in the art. For information related to the IEEE XAUI Standard, readers are directed to "IEEE Standard for Information Technology-Telecommunications and Information Exchange between Systems-Local and Metropolitan Area Networks—Specific Requirements Part 3: Carrier Sense Multiple Access with Collision Detection (CSMA/CD) Access Method and Physical Layer Specifications," IEEE Std 802.3ae-2002 (Amendment to IEEE Std 802.3-2002), 2002, pp. 1–516.

Step 2 calibrates the Replica DAC current as follows:
a. Enable Replica DAC current K and set K to a nominal value (K=0.1).
b. Force timing recovery loop such that the Receiver and Transmitter are 180° out of phase. This forces the Receiver to sample the hybrid output between transitions. This is shown in FIG. 2B as a sampling point SP1.
c. Increment bias current in discrete steps by using a current DAC (not shown) until the sample hybrid output is minimized. This step determines the optimal K for the attached $Z_L$. The mathematical relationship between K and $Z_L$ is $K \sim 4/(20+R_0/Z_L)$ where $R_0$ is an on-chip reference resistor with a nominal value.

This relationship is true for both exemplary configurations shown in FIG. 3. For example, $R_0$=1000 Ohms; $R_0/20=Z_L=50$ Ohms>K=0.1.

At this point, the Replica DAC current K should be calibrated for optimum DC matching in the presence of $Z_L$. The present invention is not limited by $Z_L=R_0/20$. Since $Z_L$ is normalized to the on-chip reference of 1000 Ohms, the hybrid system 300 will adapt to compensate for different output impedance ratios, e.g., $R_0/22$, $R_0/18$, etc.

Step 3 calibrates the slope-matching capacitor C2 as follows:
a. Force timing recovery loop such that the Receiver and Transmitter are on the exact same phase of the clock. The Receiver sampling point SP2 is shown in FIG. 2B.
b. Transmit random data through both the Main DAC and the Replica DAC over a brief period of time, e.g., several nanoseconds.
c. Observe sampled voltage at the receiver input.
d. Adjust value of the capacitor C2 until the voltage at the receiver input changes sign, e.g., from positive to negative, or vice versa. In an embodiment, the slope-matching capacitor C2 is a capacitor array with pass-transistors configured to switch trim elements in or out.

At this point, these adjustable components are calibrated for optimal hybrid performance for the load impedance $Z_L$. In an ideal case, $Z_L$ is 50 Ohms. If $Z_L$ changes, the calibration procedure should be repeated for optimal performance. The present system will adapt to compensate the change as discussed above.

The present invention is compatible with both types, i.e., analog and digital, of echo-cancellers as well as mixed-signal echo-cancellers. In an embodiment, a 0 dB loss hybrid system according to the present invention employs only three resistors R1, R3, and R4. R1 is adjustable as described above. Since a hybrid implementing the calibration method described herein is not affected by the value of R2, it can be removed, omitted, or otherwise made optional. This configuration maximizes the gain on the hybrid. Although such a three-resistor hybrid system would be more sensitive to DAC mismatches, the calibration procedure according to the present invention advantageously mitigates the increased sensitivity.

A significant advantage of the present invention is that a hybrid implementing the present invention is insensitive to mismatches between on- and off-components. Accordingly, hybrid performance is invariably maximized despite of component mismatches and variations including imperfections.

The output impedance calibration network/mechanism described above automatically adjusts output impedance to match $Z_L$. This advantageously eliminates any buffer-amplifier stages. Moreover, the slope-matching (bandwidth matching) network/mechanism described above is done via on-chip components and does not require a variable resistor. On-chip implementation also means that no additional input/output (I/O) pads are required. Other advantages include insensitivity to parametric variations in package, boards, and off-chip components connected to the node X. The output impedance calibration method is compatible with the XAUI Standard mentioned above.

Since off-chip components are not required, engineers and chip designers alike can now have more flexibility and freedom in configuring/designing hybrid systems and therefore the communication systems. As one skilled in the art will appreciate, most communication systems embodying one or more hybrids can be implemented with the present invention. To the extent that a particular communication system configuration is constructed or otherwise programmed to implement hybrid structure and/or the output impedance calibration method according to the present invention, it becomes a special purpose communication system within the scope and spirit of the present invention. The techniques and computer medium necessary for such implementations are well known to those skilled in the art and thus are not further described herein for the sake of brevity.

Although the present invention and its advantages have been described in detail, it should be understood that the present invention is not limited to or defined by what is shown or described herein. As one of ordinary skill in the art will appreciate, various changes, substitutions, and alterations could be made or otherwise implemented without departing from the principles of the present invention. For example, the output impedance matching network/mechanism does not have to be used in conjunction with the slope-matching network/mechanism. They can be implemented separately and/or independently. In addition, not all of the calibration steps must be performed. For example, one can calibrate the output impedance, the replica DAC bias current, or a combination thereof. Accordingly, the scope of the present invention should be determined by the following claims and their legal equivalents.

We claim:

1. An output impedance calibration method for invariably maximizing hybrid performance, said method comprising one or more steps selected from the group consisting of:
    a) calibrating an adjustable resistor R1 by
        disabling a replica digital-to-analog converter (DAC) current K;
        transmitting constant current (DC) from a main DAC;
        measuring an input peak amplitude $A_{peak\_1}$ at a receiver;
        transmitting random data within a time constraint; and
        adjusting R1 until an input peak amplitude $A_{peak\_i}$ is on average half of $A_{peak\_1}$, thereby matching R1 to a load impedance $Z_L$;
    b) calibrating K for optimum DC matching in presence of $Z_L$ by
        enabling K;
        setting K to a nominal value;
        forcing a timing recovery loop such that said receiver and a corresponding transmitter are 180 degree out of phase, thereby forcing said receiver to sample hybrid output between transitions; and incrementing bias current in discrete steps until sampled hybrid output is minimized on average, thereby rendering an optimal K for $Z_L$; and c) calibrating a slope-matching capacitor C2 by forcing said timing recovery loop such that said receiver and said transmitter are in phase;

transmitting random data within a time constraint through both said main DAC and said replica DAC;

observing sampled voltage at an input of said receiver; and adjusting C2 until voltage at said receiver input changes sign.

2. The method according to claim 1, further comprising the step of:

repeating steps a)–c) in response to a change in $Z_L$.

3. The method according to claim 1, in which step a) further comprises the step of:

setting K to zero.

4. The method according to claim 1, wherein in step b) said nominal value is 0.1.

5. The method according to claim 1, wherein in step b) K approximately equals $4/(20+R_0/Z_L)$, where $R_0$ is an on-chip reference resistor.

6. The method according to claim 5, wherein $R_0=1000$ Ohms and $Z_L=R_0/20$.

7. The method according to claim 1, in which $Z_L$ is an off-chip component normalized to $R_0$, where $R_0$ is an on-chip reference resistor.

8. An echo canceller implementing the method steps of claim 1, the echo canceller comprising:

digital data directly connected to said replica DAC and said main DAC;

a capacitor C1 connected to said adjustable resistor R1;

a resistor R3 connected to said receiver;

a resistor R4 connected to said receiver; and a capacitor Cbig connected to said load impedance $Z_L$; wherein Cbig and $Z_L$ are off-chip components; and wherein said optimal K invariably maximizes said hybrid performance regardless of mismatches between on and off-chip components.

9. The echo canceller according to claim 8, in which C2 is a capacitor array with pass-transistors configured to switch trim elements in or out.

10. The echo canceller according to claim 8, in which R1 is an array of switched resistors, a voltage-controlled resistor, or a combination thereof.

11. The echo canceller according to claim 8, in which said echo canceller is a mixed-signal echo canceller.

12. The echo canceller according to claim 8, in which said echo canceller is a hybrid local-echo canceller.

13. A full-duplex communication system programmed to perform the method of claim 1.

14. A communication system programmed to perform the method of claim 1.

15. A digital computer system programmed to perform the method of claim 1.

16. A computer readable medium tangibly embodying a computer-executable program of instructions implementing the method of claim 1.

* * * * *